(12) United States Patent
Ozawa

(10) Patent No.: US 7,927,953 B2
(45) Date of Patent: Apr. 19, 2011

(54) NONVOLATILE SEMICONDUCTOR MEMORY DEVICE AND METHOD FOR MANUFACTURING THE SAME

(75) Inventor: Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/575,906

(22) Filed: Oct. 8, 2009

(65) Prior Publication Data

US 2010/0140684 A1    Jun. 10, 2010

(30) Foreign Application Priority Data

Dec. 10, 2008 (JP) ................. 2008-314187

(51) Int. Cl.
- H01L 21/8238 (2006.01)
- H01L 21/336 (2006.01)
- H01L 21/4763 (2006.01)

(52) U.S. Cl. ........ 438/287; 438/211; 438/257; 438/259; 438/263; 438/591; 257/E21.21; 257/E21.267; 257/E21.293; 257/E21.423

(58) Field of Classification Search ............. 257/E21.21, 257/E21.267, E21.293, E21.423
See application file for complete search history.

(56) References Cited

U.S. PATENT DOCUMENTS

| | | | |
|---|---|---|---|
| 2006/0166440 A1* | 7/2006 | Kaneoka et al. | 438/257 |
| 2008/0070368 A1* | 3/2008 | Kim et al. | 438/287 |
| 2008/0173932 A1 | 7/2008 | Kidoh et al. | |
| 2010/0176439 A1* | 7/2010 | Yonamoto | 257/324 |

FOREIGN PATENT DOCUMENTS

| | | |
|---|---|---|
| JP | 2000-49159 | 2/2000 |
| JP | 2008-171918 | 7/2008 |
| WO | WO 2009/075370 A1 | 6/2009 |

OTHER PUBLICATIONS

Hirohisa et al., English Machine Translated of JP Publication No. 2007-317874, Dec. 6, 2007; (Machine Translated Dec. 1, 2010).*
U.S. Appl. No. 12/679,991, filed Mar. 25, 2010, Fukuzumi et al.
Yasumasa Suizu, "A Method of Making Oxynitrides by Interface Nitridation Through Silicon", Journal of The Electrochemical Society, 148 (4) F51-F55 (2001).

* cited by examiner

Primary Examiner — Charles D Garber
Assistant Examiner — Mohsen Ahmadi
(74) Attorney, Agent, or Firm — Oblon, Spivak, McClelland, Maier & Neustadt, L.L.P.

(57) ABSTRACT

On a silicon substrate is formed a stacked body by alternately stacking a plurality of silicon oxide films and silicon films, a trench is formed in the stacked body, an alumina film, a silicon nitride film and a silicon oxide film are formed in this order on an inner surface of the trench, and a channel silicon crystalline film is formed on the silicon oxide film. Next, a silicon oxide layer is formed at an interface between the silicon oxide film and the channel silicon crystalline film by performing thermal treatment in an oxygen gas atmosphere.

8 Claims, 11 Drawing Sheets

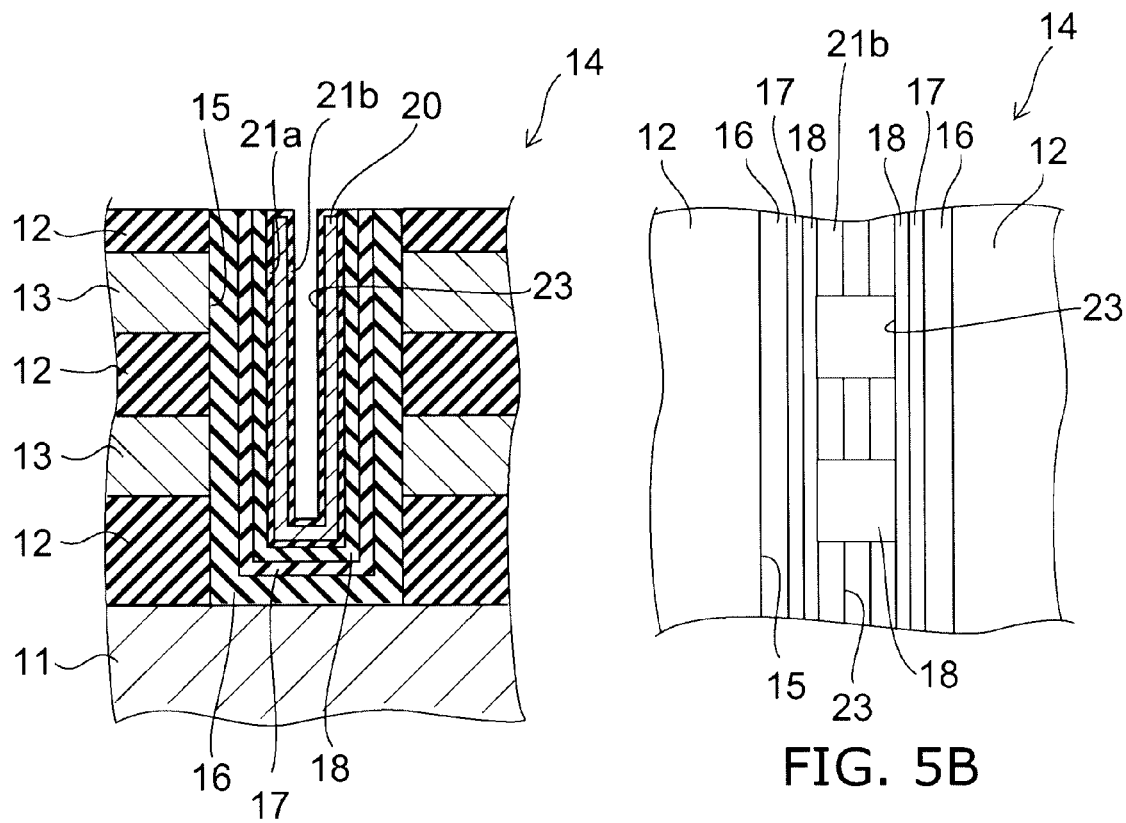
FIG. 5A
FIG. 5B
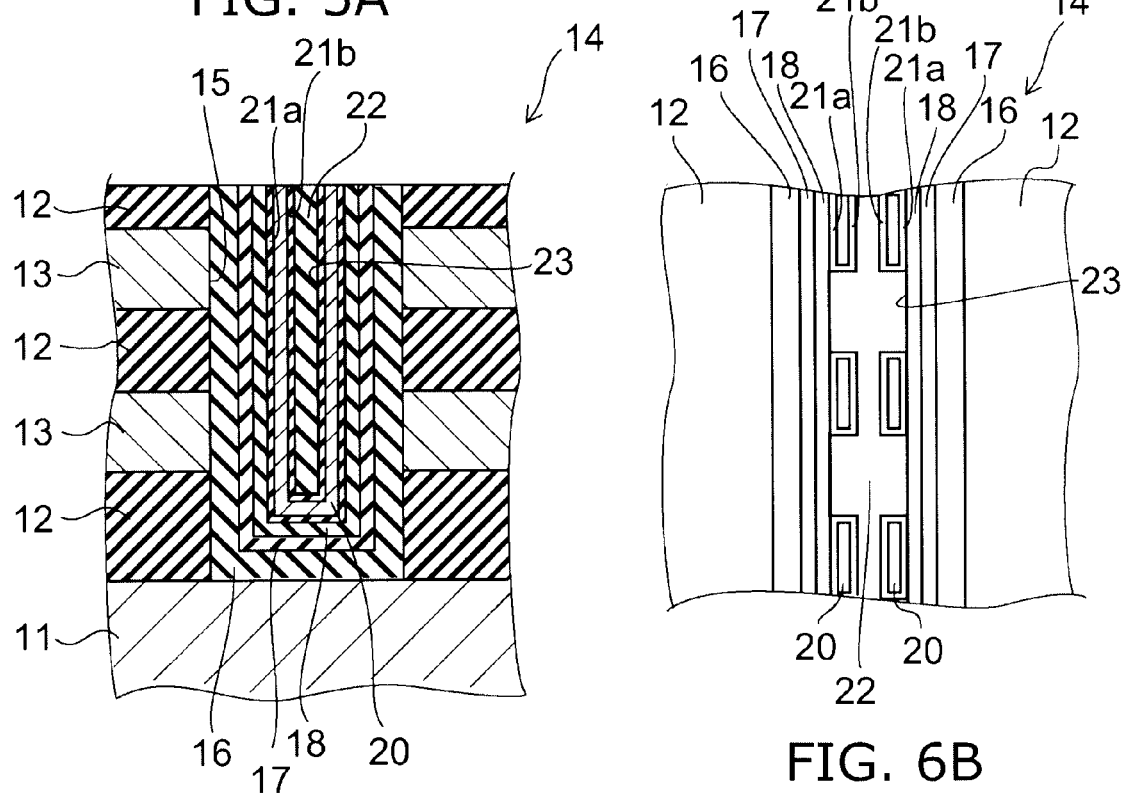
FIG. 6A
FIG. 6B

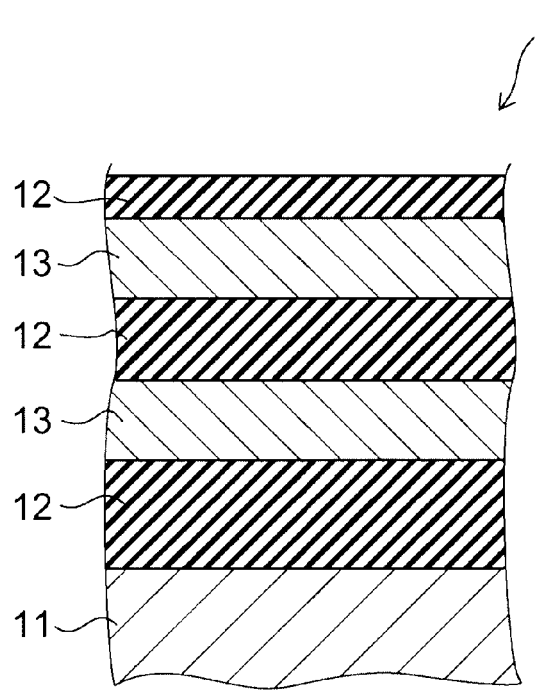 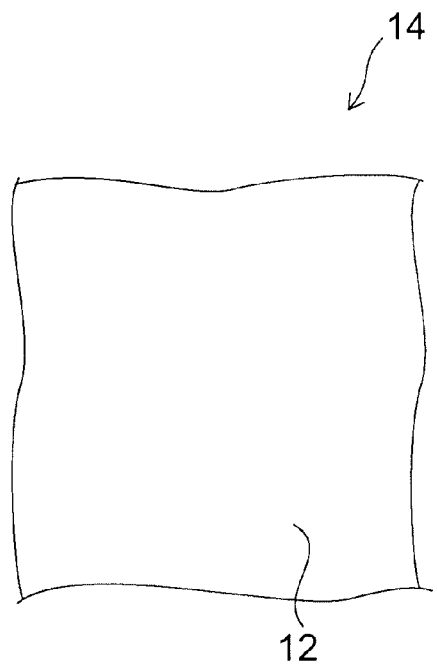
FIG. 9A  FIG. 9B
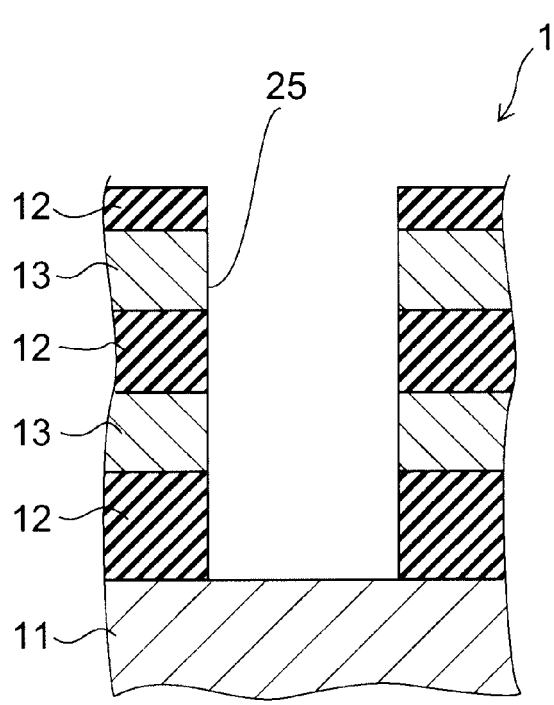 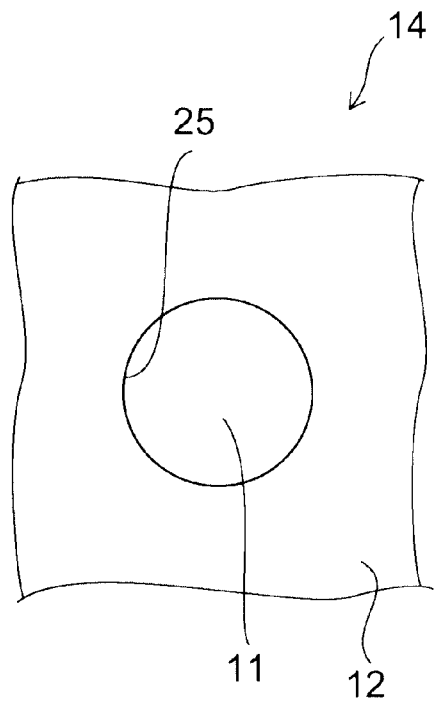
FIG. 10A  FIG. 10B

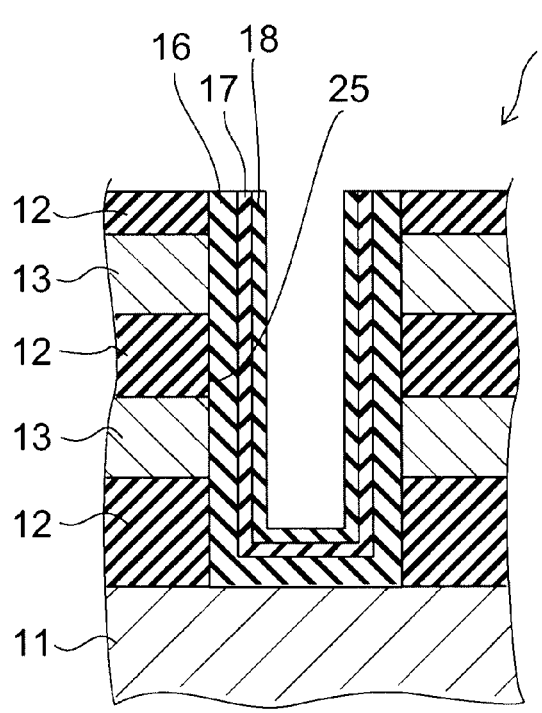
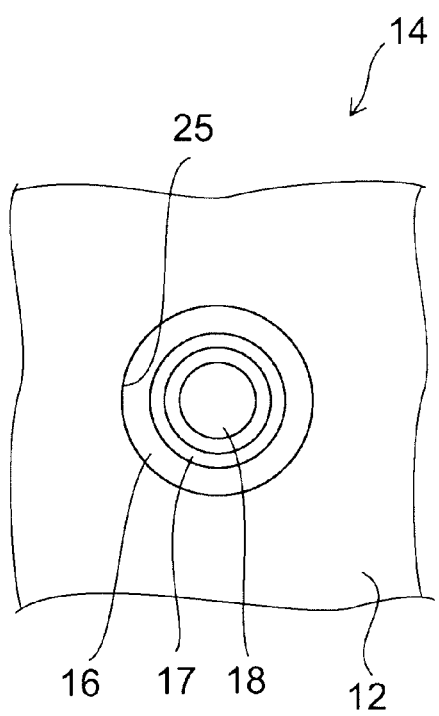
FIG. 11A  FIG. 11B
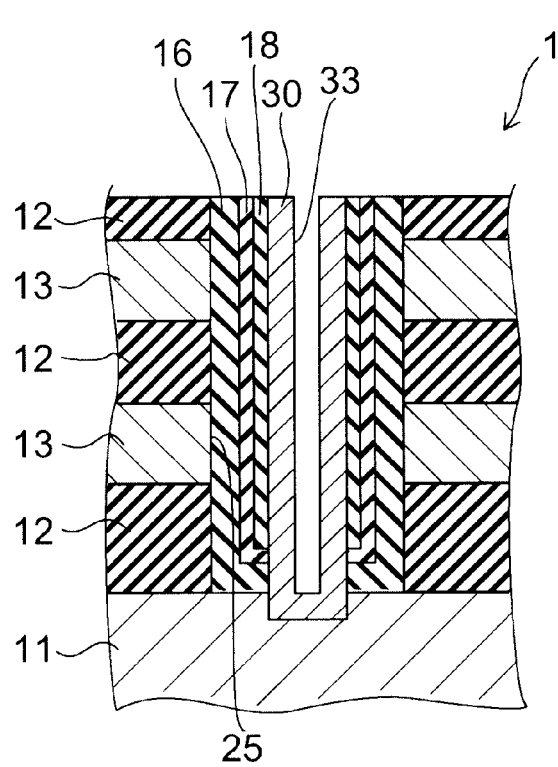
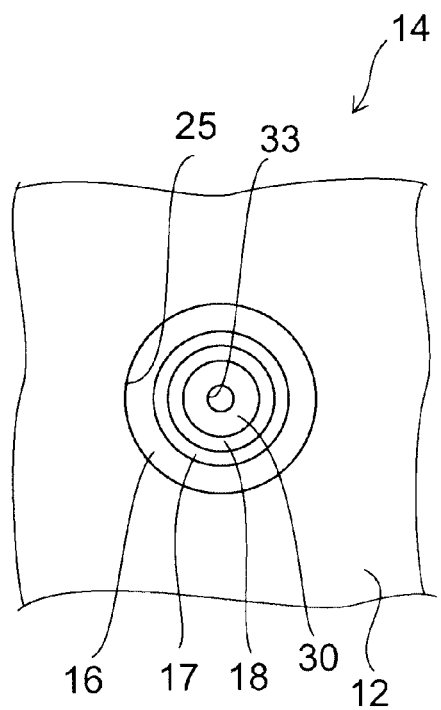
FIG. 12A  FIG. 12B

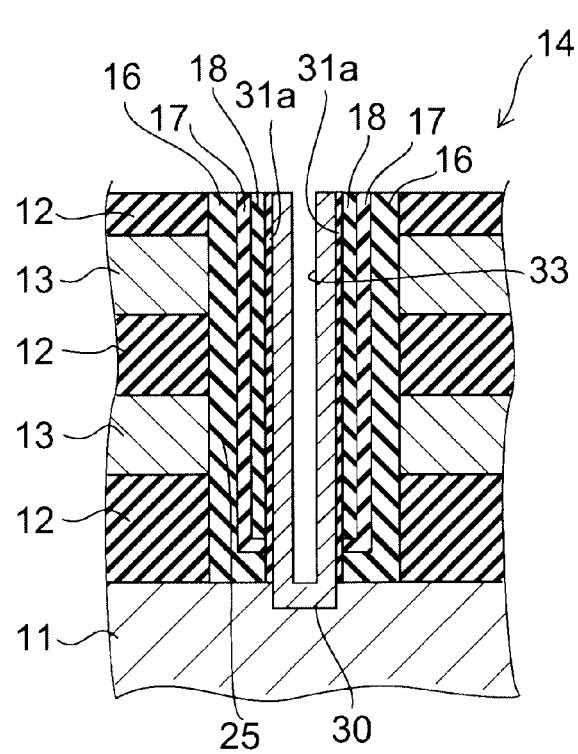
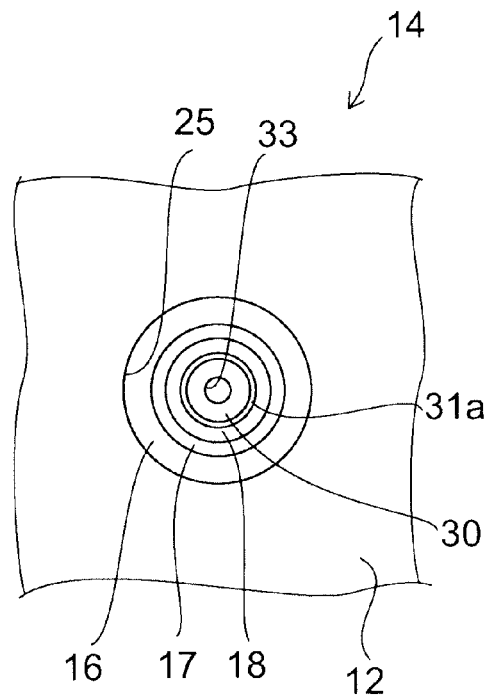
FIG. 15A
FIG. 15B
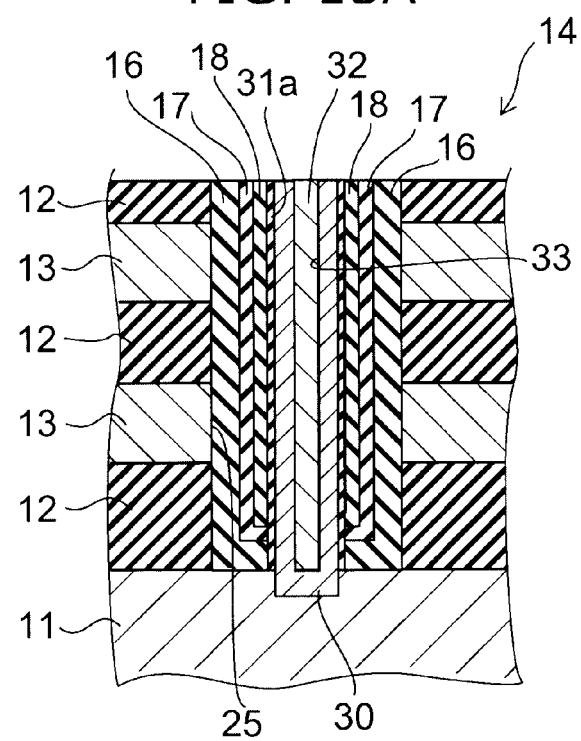
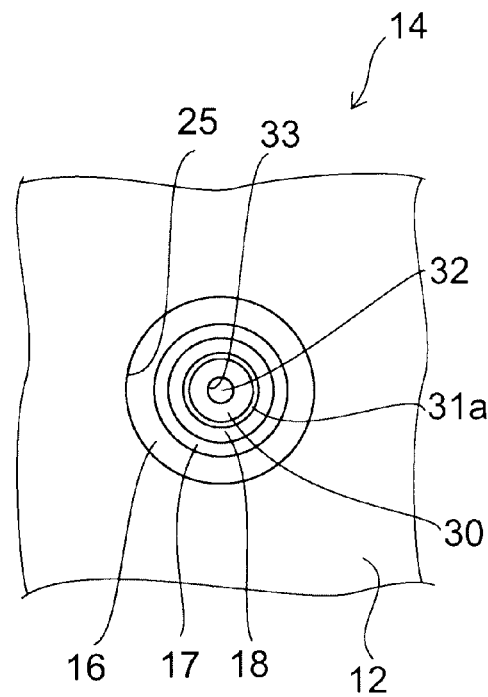
FIG. 16A
FIG. 16B

US 7,927,953 B2

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2008-314187, filed on Dec. 10, 2008; the entire contents of which are incorporated herein by reference.

BACKGROUND OF THE INVENTION

1. Field of the Invention

This invention relates to a nonvolatile semiconductor memory device in which a channel film made of silicon is formed on an insulating film, and a method for manufacturing the same.

2. Background Art

Recently, as an alternative to the planar nonvolatile semiconductor memory device, a nonvolatile semiconductor memory device in which a plurality of MONOS (metal-oxide-nitride-oxide-silicon) type memory cells are three-dimensionally stacked has been developed (see, e.g., JP-A-2008-171918(Kokai)). This nonvolatile semiconductor memory device is manufactured as follows. Gate electrodes and interlayer insulating films are alternately formed on a substrate to form a stacked body, and a through hole extending in the stacking direction of the stacked body is formed therein. A charge block film, a charge storage film, and a tunnel insulating film are formed in this order on the inner surface of the through hole. Subsequently, silicon is deposited by the CVD (chemical vapor deposition) process, for instance. Thus, a vertically extending silicon pillar is buried in the through hole, and serves as a channel of memory cells.

However, in this manufacturing method, the silicon pillar is formed by depositing silicon on the tunnel insulating film. Hence, microscopic structural defects at the atomic level are generated at high density at the interface between the tunnel insulating film and the silicon pillar, and this structural defect forms an interface state or a fixed charge. This decreases the operating speed of the cell transistor constituting the memory cell. Furthermore, the threshold voltage of the cell transistor varies after prolonged operation and causes malfunctions.

SUMMARY OF THE INVENTION

According to an aspect of the invention, there is provided a method for manufacturing a nonvolatile semiconductor memory device, including: forming a charge storage film, a tunnel insulating film, and a channel film made of a silicon crystal in this order on a gate electrode; and forming a silicon oxide layer at an interface between the tunnel insulating film and the channel film by performing thermal treatment in an oxygen gas atmosphere.

According to an aspect of the invention, there is provided a method for manufacturing a nonvolatile semiconductor memory device, including: forming a charge storage film, a tunnel insulating film, and a channel film made of a silicon crystal in this order on a gate electrode; and forming a silicon oxynitride layer at an interface between the tunnel insulating film and the channel film by performing thermal treatment in a nitrogen monoxide gas atmosphere.

According to an aspect of the invention, there is provided a nonvolatile semiconductor memory device including: a substrate; a stacked body provided on the substrate, the stacked body including a plurality of interlayer insulating films and gate electrodes alternately stacked therein, and the stacked body including a trench; a charge storage film provided on an inner surface of the trench; a tunnel insulating film provided on the charge storage film; and a channel film provided on the tunnel insulating film and made of a silicon crystal, one of a silicon oxide layer and a silicon oxynitride layer being formed at an interface between the tunnel insulating film and the channel film.

BRIEF DESCRIPTION OF THE DRAWINGS

FIGS. 1A and 1B to 6A and 6B illustrate a method for manufacturing a nonvolatile semiconductor memory device according to a first embodiment of the invention, where each figure with the suffix A is a process cross-sectional view, and each figure with the suffix B is a process plan view;

FIGS. 7A and 7B to 8A and 8B are process cross-sectional views illustrating a method for manufacturing a nonvolatile semiconductor memory device according to a second embodiment of the invention, where each figure with the suffix B is a partially enlarged view of region R shown in the corresponding figure with the suffix A;

FIGS. 9A and 9B to 14A and 14B illustrate a method for manufacturing a nonvolatile semiconductor memory device according to a third embodiment of the invention, where each figure with the suffix A is a process cross-sectional view, and each figure with the suffix B is a process plan view;

FIGS. 15A, 15B, 16A, and 16B illustrate a method for manufacturing a nonvolatile semiconductor memory device according to a fourth embodiment of the invention, where each figure with the suffix A is a process cross-sectional view, and each figure with the suffix B is a process plan view;

DETAILED DESCRIPTION OF THE INVENTION

Embodiments of the invention will now be described with reference to the drawings.

At the outset, a first embodiment of the invention is described.

FIGS. 1A and 1B to 6A and 6B illustrate a method for manufacturing a nonvolatile semiconductor memory device according to this embodiment, where each figure with the suffix A is a process cross-sectional view, and each figure with the suffix B is a process plan view.

Figure 1A:
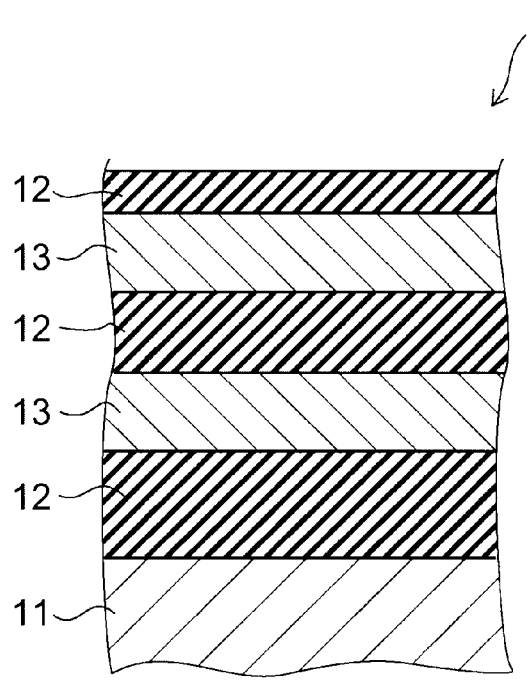
Figure 1B:
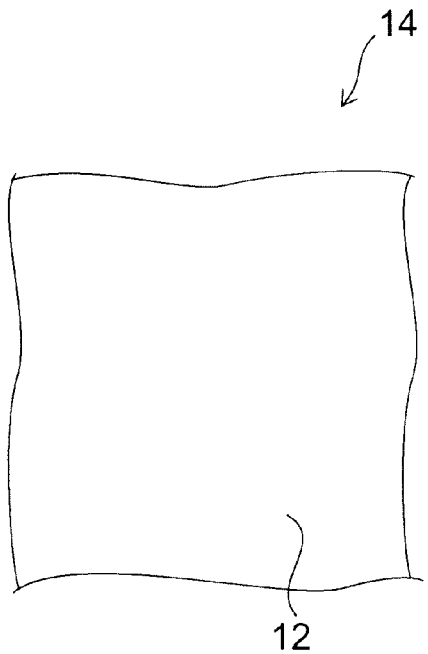

First, as shown in FIGS. 1A and 1B, on a silicon substrate 11, illustratively by the CVD process, silicon oxide films 12 to serve as interlayer insulating films and impurity-doped silicon films 13 to serve as gate electrodes are alternately deposited to form a multilayer body 14. The thickness of the silicon oxide film 12 and the silicon film 13 is e.g. 50 nm (nanometers) each. Although FIG. 1A shows only two silicon films 13, this embodiment is not limited thereto. The number of silicon films 13 is arbitrary.

Figure 2A:
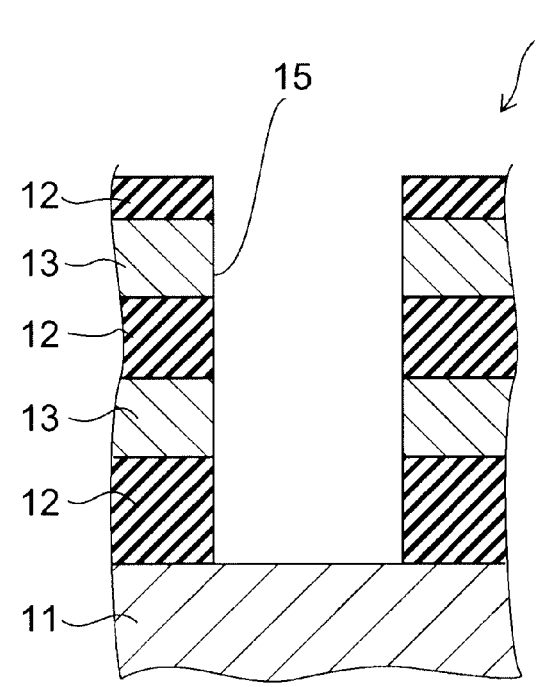
Figure 2B:
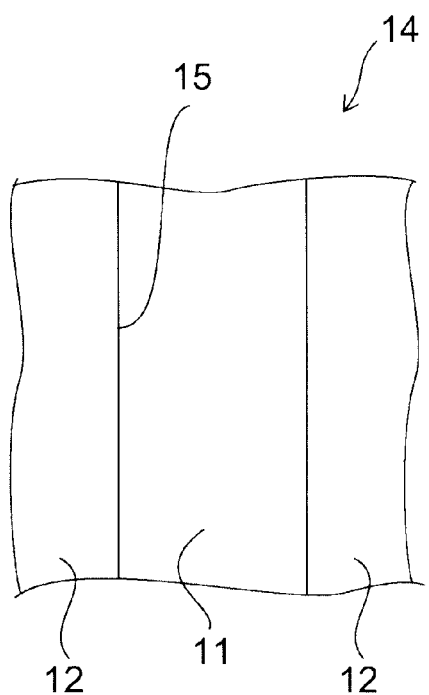

Next, as shown in FIGS. 2A and 2B, a resist mask (not shown) is formed on the stacked body 14 and used as a mask to perform RIE (reactive ion etching). Thus, the silicon oxide films 12 and the silicon films 13 are selectively removed to form a trench 15 in the stacked body 14. The trench 15 is shaped like a groove, and its width is e.g. approximately 70 nm. The silicon oxide films 12 serving as interlayer insulating films and the silicon films 13 serving as gate electrodes are exposed to the side surface of the trench 15. Furthermore, the silicon substrate 11 is exposed to the bottom surface of the trench 15.

Figure 3A:
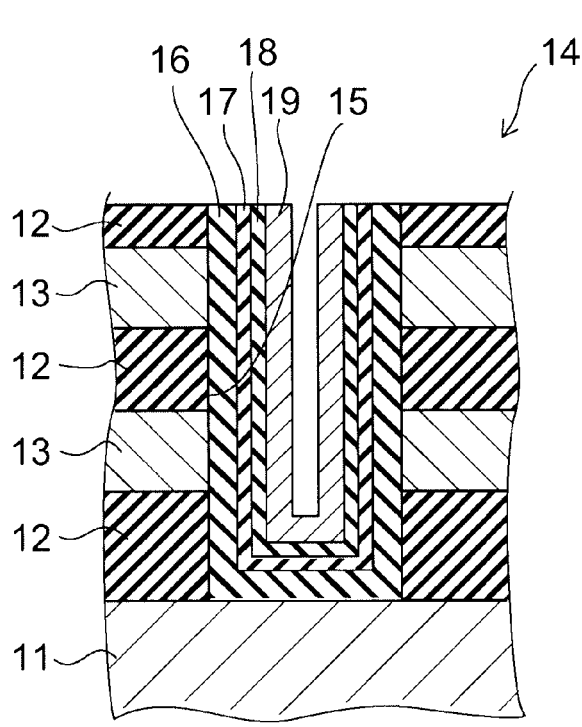
Figure 3B:
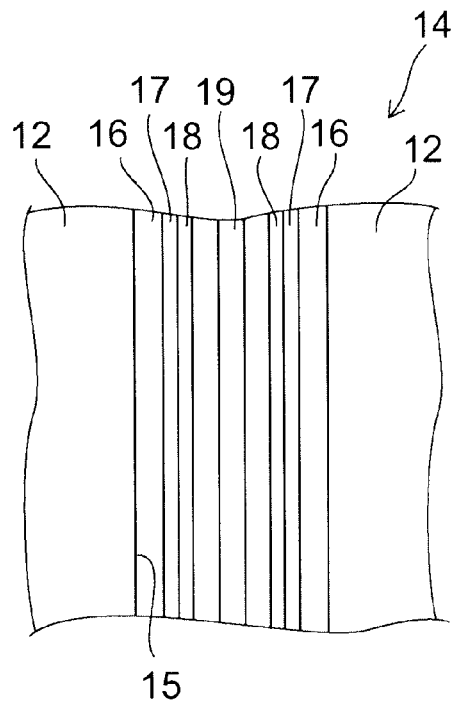

Next, as shown in FIGS. 3A and 3B, by the ALD (atomic layer deposition) process, an alumina film 16 having a thickness of e.g. 10 nm to serve as a charge block film, a silicon nitride film 17 having a thickness of e.g. 5 nm to serve as a charge storage film, and a silicon oxide film 18 having a thickness of e.g. 5 nm to serve as a tunnel insulating film are deposited in this order on the inner surface of the trench 15. The charge block film is a film which does not substantially pass a current even if a voltage in the operating voltage range of the nonvolatile semiconductor memory device according to this embodiment is applied. The charge storage film is a film capable of storing charge, such as a film containing electron trap states. The tunnel insulating film is a film which is normally insulative, but passes a tunneling current when a prescribed voltage in the operating voltage range of the nonvolatile semiconductor memory device is applied.

Next, by the CVD process, an impurity-doped amorphous silicon film is deposited on the silicon oxide film 18 to a thickness of e.g. 10 nm. Here, the source gas used for CVD is illustratively silane ($SiH_4$). The amorphous silicon film does not completely fill in the trench 15, but a cavity remains in the trench 15. Subsequently, thermal treatment is performed at a temperature of e.g. 500° C. or more to crystallize this amorphous silicon film into a polycrystalline silicon film 19. Alternatively, by adjusting the film formation temperature of CVD, polycrystalline silicon can be deposited on the silicon oxide film 18 to form a polycrystalline silicon film 19.

Figure 4A:
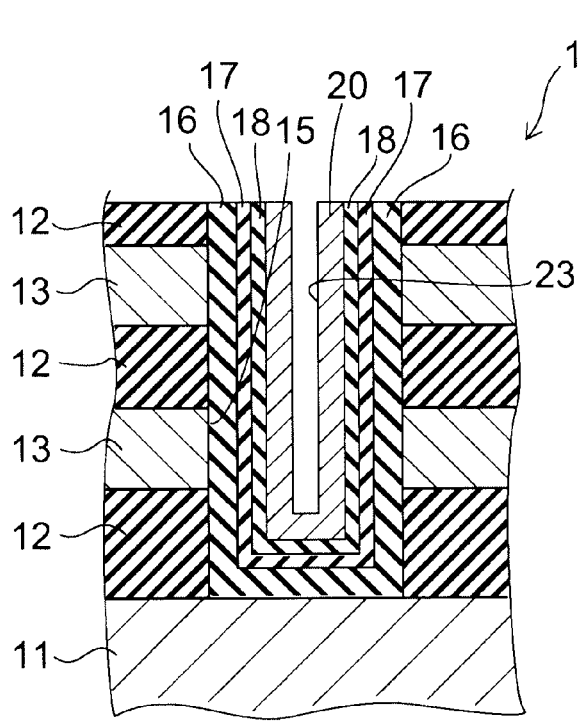
Figure 4B:
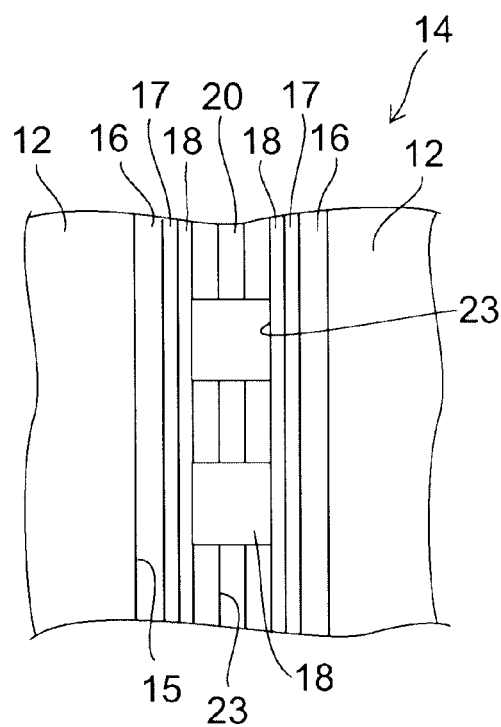

Next, as shown in FIGS. 4A and 4B, a resist mask (not shown) is formed on the stacked body 14 and used as a mask to perform RIE to selectively remove the polycrystalline silicon film 19. Thus, the polycrystalline silicon film 19 is divided along the extending direction of the trench 15 into a plurality of U-shaped channel silicon crystal films 20. Here, the space in the trench 15 devoid of the alumina film 16, the silicon nitride film 17, the silicon oxide film 18, and the channel silicon crystal film 20 constitutes a cavity 23. The cavity 23 communicates with the outside of the trench 15, and the channel silicon crystal film 20 is exposed to the inner surface of the cavity 23. Although FIG. 4B shows only three channel silicon crystal films 20, this embodiment is not limited thereto. The number of channel silicon crystal films 20 is arbitrary.

Next, as shown in FIGS. 5A and 5B, thermal oxidation is performed in an oxygen gas ($O_2$) atmosphere. The condition for this thermal oxidation is such that the temperature is e.g. 700 to 1200° C. and the duration is e.g. 1 minute to 1 hour. Thus, a silicon oxide layer 21a having a thickness of e.g. approximately 0.2 to 2 nm is formed at the interface between the channel film (channel silicon crystal film 20) and the tunnel insulating film (silicon oxide film 18). Here, by this thermal oxidation, a silicon oxide layer 21b is formed also at the exposed surface of the channel silicon crystal film 20. The thickness of the silicon oxide layer 21b is approximately 1.5 to 3 times the thickness of the silicon oxide layer 21a, although it depends on the thickness and thermal treatment condition of the channel silicon crystal film 20.

Next, as shown in FIGS. 6A and 6B, silicon oxide is deposited or applied on the entire surface to bury a silicon oxide 22 in the cavity 23. The silicon oxide 22 constitutes a device isolation insulating film. Next, CMP (chemical mechanical polishing) is performed to remove the silicon oxide 22 and the silicon oxide layer 21b from above the upper surface of the stacked body 14 to expose the upper surface of the channel silicon crystal film 20. Thus, a memory array section is formed on the silicon substrate 11. In the memory array section, a NAND string is constructed for each U-shaped channel silicon crystal film 20. In each NAND string, a plurality of MONOS type memory cell transistors are arranged and series connected along the extending direction of the channel silicon crystal film 20. Subsequently, by conventional techniques, select gate transistors, interconnect layers, and peripheral elements (all not shown) are formed to manufacture a nonvolatile semiconductor memory device having a three-dimensional stacked structure.

As shown in FIGS. 6A and 6B, in this nonvolatile semiconductor memory device, a stacked body 14 with a plurality of interlayer insulating films (silicon oxide films 12) and gate electrodes (silicon films 13) alternately stacked therein is provided on a silicon substrate 11, and a trench 15 is formed in the stacked body 14. A charge block film (alumina film 16), a charge storage film (silicon nitride film 17), and a tunnel insulating film (silicon oxide film 18) are provided in this order on the inner surface of the trench 15, and a channel silicon crystal film 20 made of a silicon crystal is provided on the tunnel insulating film (silicon oxide film 18). Furthermore, a silicon oxide layer 21a is formed at the interface between the tunnel insulating film (silicon oxide film 18) and the channel film (channel silicon crystal film 20).

Next, the function and effect of this embodiment are described.

In this embodiment, in order to efficiently manufacture a nonvolatile semiconductor memory device having a three-dimensional stacked structure, interlayer insulating films (silicon oxide films 12) and gate electrodes (silicon films 13) are alternately deposited to form a stacked body 14, and subsequently a trench 15 is formed. Then, a charge block film (alumina film 16), a charge storage film (silicon nitride film 17), and a tunnel insulating film (silicon oxide film 18) are formed on the inner surface of the trench 15, and a channel film (channel silicon crystal film 20) is formed thereon. That is, in the process shown in FIGS. 3A and 3B, an amorphous silicon film is deposited on the silicon oxide film 18 by the CVD process. At this time, at the interface between the silicon oxide film 18 and the amorphous silicon film, hydroxy groups resulting from the CVD source gas (such as silane) remain, and/or dangling bonds are formed. Thus, microscopic structural defects are generated. When the amorphous silicon film is crystallized and processed into a channel silicon crystal film 20, this structural defect remains at the interface between the silicon oxide film 18 and the channel silicon crystal film 20, and generates an interface state or a fixed charge.

Thus, in this embodiment, in the process shown in FIGS. 5A and 5B, thermal treatment is performed in an oxygen gas atmosphere. When thermal treatment is performed in the condition where the channel silicon crystal film 20 made of silicon in the crystalline state is exposed to the oxygen gas atmosphere, a silicon oxide layer 21b is generated at the exposed surface of the channel silicon crystal film 20, and a silicon oxide layer 21a is formed also at the opposite surface, that is, at the interface with the silicon oxide film 18. This is presumably because oxygen gas is resistant to dissociation in the silicon film, diffusing to the opposite surface of the silicon film, where it is dissociated and causes oxidation reaction. Because the silicon oxide layer 21a is formed at the interface between the silicon oxide film 18 and the channel silicon crystal film 20, microscopic structural defects generated at the interface between the silicon oxide film 18 and the channel silicon crystal film 20 are captured in the silicon oxide layer 21a. Thus, interface states and fixed charges are significantly reduced. As an example, the density of interface states and fixed charges is $1 \times 10^{12}$ cm$^{-2}$ or more when no silicon oxide layer 21a is formed, but decreases to $1 \times 10^{11}$ cm$^{-2}$ or less when the silicon oxide layer 21a is formed.

Thus, according to this embodiment, the microscopic structural state at the interface between the silicon oxide film 18 serving as a tunnel insulating film and the channel silicon crystal film 20 serving as a channel film is significantly improved, and hence the operating speed of the cell transistor is increased. Furthermore, the threshold voltage of the cell transistor is less likely to vary despite prolonged operation, and the reliability of the memory is improved.

Furthermore, in this embodiment, when the thermal treatment shown in FIGS. 5A and 5B is performed, a cavity 23 communicating with the outside of the trench 15 is formed in the trench 15, and the channel silicon crystal film 20 is exposed to the inner surface of the cavity 23. Hence, oxygen gas in the atmosphere is efficiently supplied to the entire channel silicon crystal film 20 through the cavity 23, and the silicon oxide layer 21a is formed throughout the interface between the silicon oxide film 18 and the channel silicon crystal film 20.

In the above example, an amorphous silicon film is crystallized into a polycrystalline silicon film 19, which is divided into channel silicon crystal films 20, and subsequently thermally treated in an oxygen gas atmosphere to form a silicon oxide layer 21a. However, this embodiment is not limited thereto as long as the silicon film is crystallized before thermal treatment in an oxygen gas atmosphere. For instance, the amorphous silicon film can be divided, then crystallized, and subsequently thermally treated in an oxygen gas atmosphere. Alternatively, the amorphous silicon film can be crystallized, then thermally treated in an oxygen gas atmosphere, and subsequently divided. However, preferably, thermal treatment in an oxygen gas atmosphere is performed after the division process. This is because the efficiency of supplying oxygen gas is then higher and facilitates forming a silicon oxide layer 21a, and physical and electrical damage during the division process can be recovered.

Next, a second embodiment of the invention is described.

FIGS. 7A and 7B to 8A and 8B are process cross-sectional views illustrating a method for manufacturing a nonvolatile semiconductor memory device according to this embodiment, where each figure with the suffix B is a partially enlarged view of region R shown in the corresponding figure with the suffix A.

Figure 7A:
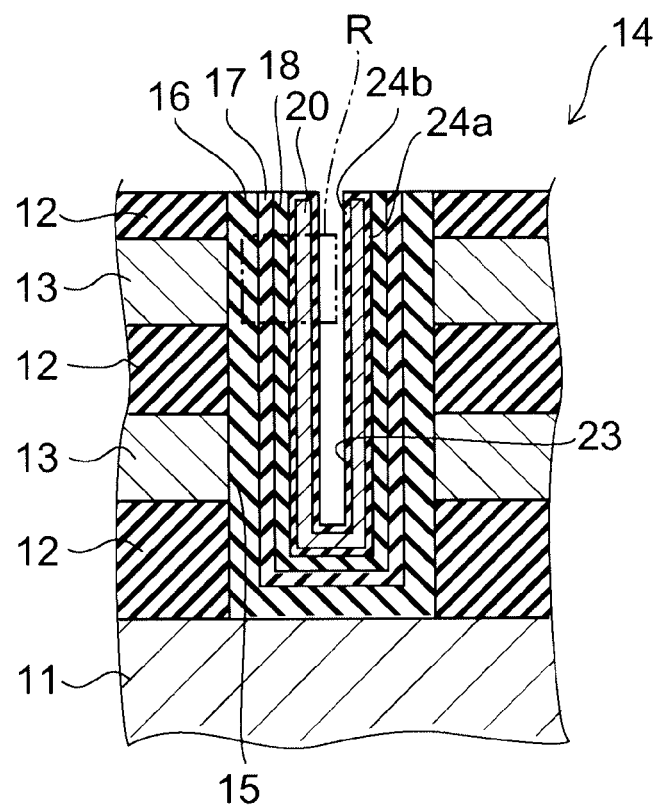

First, by a method similar to that in the above first embodiment, a structure shown in FIGS. 4A and 4B is fabricated. Next, as shown in FIG. 7A, thermal oxynitridation is performed in a nitrogen monoxide gas (NO) atmosphere. The condition for this thermal oxynitridation is such that the temperature is e.g. 700 to 1200° C. and the duration is e.g. 1 minute to 1 hour. Here, the nitrogen monoxide gas atmosphere is not limited to an atmosphere containing only nitrogen monoxide gas, but can be any atmosphere containing nitrogen monoxide gas.

By this thermal oxynitridation, a silicon oxynitride layer 24a having a thickness of e.g. approximately 0.2 to 2 nm is formed at the interface between the channel silicon crystal film 20 and the silicon oxide film 18. At this time, a silicon oxynitride layer 24b is formed also at the exposed surface of the channel silicon crystal film 20. The thickness of this silicon oxynitride layer 24b is approximately 1.5 to 3 times the thickness of the silicon oxynitride layer 24a, although it depends on the thickness and thermal treatment condition of the channel silicon crystal film 20. Here, the silicon oxynitride layer is formed not only at the exposed surface of the channel silicon crystal film 20, but also at the interface with the silicon oxide film 18. This is presumably because nitrogen monoxide gas is resistant to dissociation in the silicon film, diffusing from the exposed surface into the silicon film and reaching the opposite surface of the silicon film, where it is dissociated and causes oxidation and nitridation reaction.

Figure 7B:
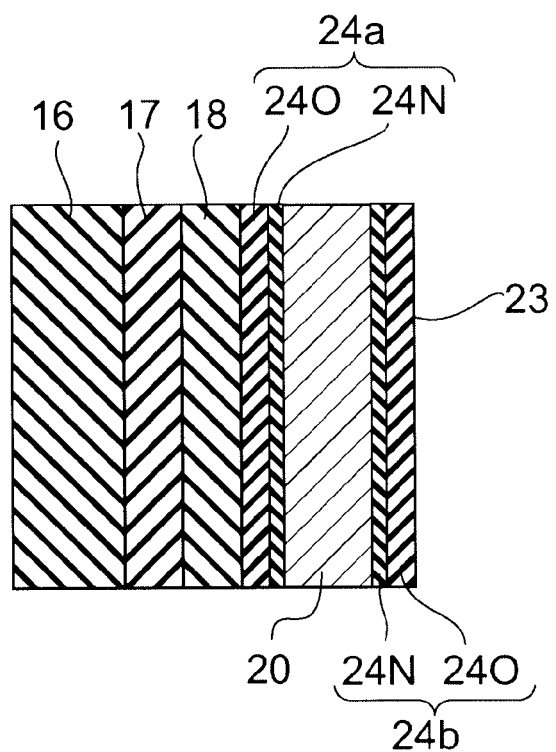

Furthermore, as shown in FIG. 7B, the silicon oxynitride layers 24a and 24b have a characteristic composition in the thickness direction. More specifically, in each of the silicon oxynitride layers 24a and 24b, a nitrogen-rich layer 24N having a relatively high nitrogen concentration is formed near the interface with the channel silicon crystal film 20, and an oxygen-rich layer 24O having a relatively high oxygen concentration is formed in a region distant from the interface with the channel silicon crystal film 20. This is presumably because in the process of forming a silicon oxynitride layer at the surface of the silicon film by thermal oxynitridation, the nitrogen atom in the silicon oxynitride layer tends to segregate at the interface between the silicon film and the silicon oxynitride layer.

Figure 8A:
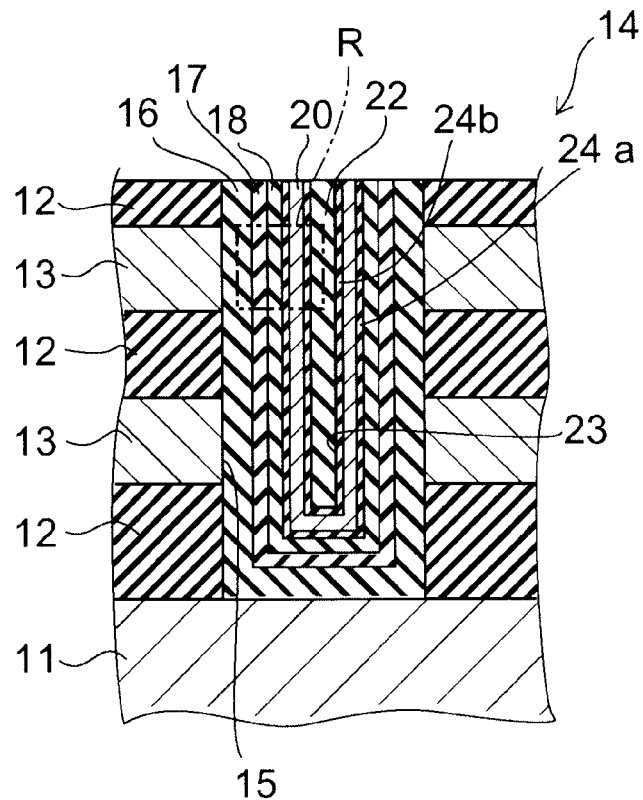
Figure 8B:
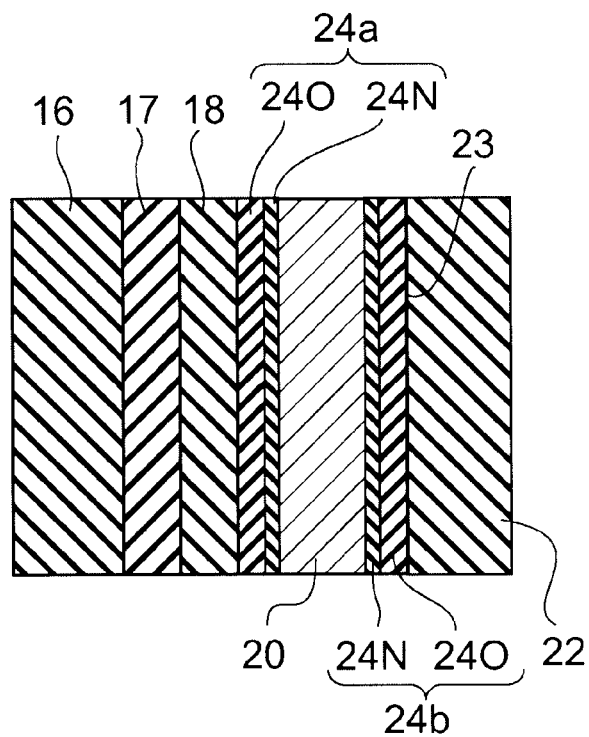

Next, as shown in FIGS. 8A and 8B, like the above first embodiment, a silicon oxide 22 is buried as a device isolation insulating film in the cavity 23. Next, CMP is performed to remove the silicon oxide 22 and the silicon oxynitride layer 24b from above the upper surface of the stacked body 14 to expose the upper surface of the channel silicon crystal film 20. Consequently, a memory array section is formed on the silicon substrate 11. Subsequently, thermal annealing is performed at a temperature of approximately 400° C. to 1000° C. to densify the silicon oxide 22. This can reduce leakage current in the silicon oxide 22 and reduce the frequency of memory malfunctions. Subsequently, select gate transistors, interconnect layers, and peripheral elements (all not shown) are formed to manufacture a nonvolatile semiconductor memory device having a three-dimensional stacked structure.

As compared with the above first embodiment, the nonvolatile semiconductor memory device according to this embodiment includes a silicon oxynitride layer 24a, instead of the silicon oxide layer 21a (see FIG. 6), at the interface between the tunnel insulating film (silicon oxide film 18) and the channel film (channel silicon crystal film 20).

Next, the function and effect of this embodiment are described.

In this embodiment, in the process shown in FIGS. 7A and 7B, thermal oxynitridation is performed in a nitrogen monoxide gas atmosphere. Thus, a silicon oxynitride layer 24a is formed at the interface between the channel silicon crystal film 20 and the silicon oxide film 18. The silicon oxynitride layer 24a is a stacked film composed of a nitrogen-rich layer 24N formed on the channel silicon crystal film 20 side and an oxygen-rich layer 24O formed on the silicon oxide film 18 side.

Consequently, microscopic structural defects generated at the interface between the silicon oxide film 18 and the channel silicon crystal film 20 are captured in the nitrogen-rich layer 24N, and interface states and fixed charges are significantly reduced. As an example, the density of interface states and fixed charges is $1 \times 10^{12}$ cm$^{-2}$ or more when no silicon oxynitride layer 24a is formed, but decreases to $1 \times 10^{11}$ cm$^{-2}$ or less when the silicon oxynitride layer 24a is formed. Thus, the operating speed of the cell transistor is increased. Furthermore, because the nitrogen-rich layer 24N is provided in contact with the channel silicon crystal film 20, degradation in the microscopic structural state of the interface, such as increase of interface states, is prevented even if data write/erase operation is repetitively performed on the memory cell. Thus, the reliability of the cell transistor is dramatically improved.

Furthermore, according to this embodiment, the surface of the channel silicon crystal film 20 is covered with the silicon oxynitride layers 24a and 24b during thermal annealing for densifying the silicon oxide 22. This can prevent the channel silicon crystal film 20 from decreasing in volume by oxidation. Thus, the frequency of malfunctions of the cell transistor can be significantly reduced, and the reliability of the device is improved. Furthermore, the nitrogen-rich layer 24N is provided at both interfaces of the channel silicon crystal film 20. This can prevent aggregation and deformation of the channel silicon crystal film 20 during thermal annealing.

In this embodiment, in the process shown in FIGS. 7A and 7B, thermal treatment in a nitrous oxide gas atmosphere, instead of the nitrogen monoxide gas atmosphere, can achieve a similar effect. In this case, the thickness of the silicon oxynitride layer 24b formed at the exposed surface of the channel silicon crystal film 20 tends to increase. Hence, this is favorable to decreasing the finish thickness of the channel silicon crystal film 20.

Next, a third embodiment of the invention is described.

FIGS. 9A and 9B to 14A and 14B illustrate a method for manufacturing a nonvolatile semiconductor memory device according to this embodiment, where each figure with the suffix A is a process cross-sectional view, and each figure with the suffix B is a process plan view.

This embodiment is different from the above first embodiment in that the trench is shaped like a cylinder rather than a groove, and that the channel silicon crystal layer is extended to the silicon substrate.

First, as shown in FIGS. 9A and 9B, by a method similar to that in the above first embodiment, a stacked body 14 is formed on a silicon substrate 11.

Next, as shown in FIGS. 10A and 10B, RIE is performed using a resist mask (not shown) to form a plurality of trenches 25 in the stacked body 14. The trench 25 is shaped like a cylinder extending in the stacking direction of the stacked body 14, and its inner diameter is e.g. 70 nm. As viewed in the stacking direction of the stacked body 14, the trenches 25 are arranged in a matrix. Furthermore, the silicon substrate 11 is exposed to the bottom surface of each trench 25. For convenience of illustration, each figure shows only one trench 25, but in practice, numerous trenches 25 are formed.

Next, as shown in FIGS. 11A and 11B, by the ALD process, an alumina film 16, a silicon nitride film 17, and a silicon oxide film 18 are deposited in this order on the inner surface of the trench 25. The thicknesses of these films are e.g. 10 nm, 5 nm, and 5 nm, respectively. After completion of the device, these films function as a charge block film, a charge storage film, and a tunnel insulating film, respectively.

Next, as shown in FIGS. 12A and 12B, a resist mask (not shown) is formed on the stacked body 14 and used as a mask to perform RIE. Thus, the silicon oxide film 18, the silicon nitride film 17, and the alumina film 16 are selectively removed from above the bottom surface of the trench 25 to expose the silicon substrate 11. At this time, the silicon substrate 11 is dug down slightly in the upper surface.

Next, by the CVD process, an impurity-doped amorphous silicon film is deposited on the inner surface of the trench 25 to a thickness of e.g. 10 nm. Subsequently, thermal treatment is performed at a temperature of e.g. 500° C. or more to crystallize this amorphous silicon film into a channel silicon crystal film 30. The lower end portion of the channel silicon crystal film 30 is in contact with the silicon substrate 11. The channel silicon crystal film 30 is shaped like a cylindrical tube with the bottom closed, and its inside constitutes a cavity 33. That is, the cavity 33 communicates with the outside of the trench 25, and the channel silicon crystal film 30 is exposed to the inner surface of the cavity 33. Alternatively, by adjusting the film formation temperature of CVD, polycrystalline silicon can be deposited on the inner surface of the trench 25 to form a channel silicon crystal film 30.

Figure 13A:
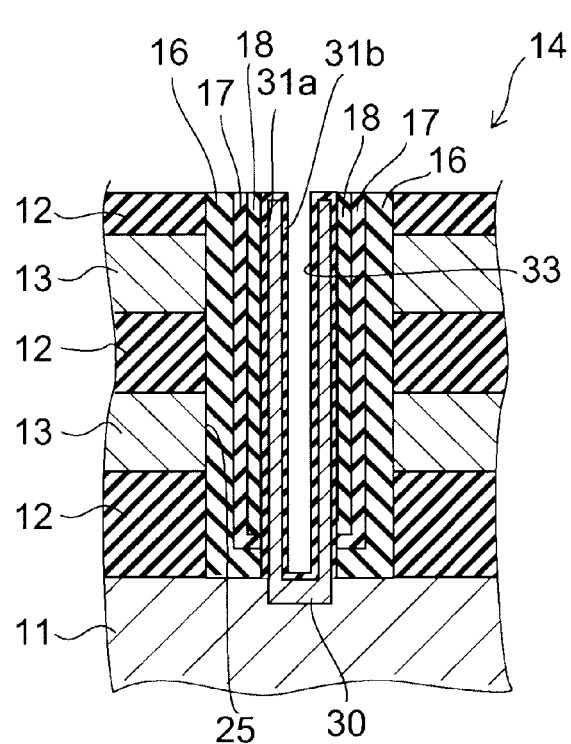
Figure 13B:
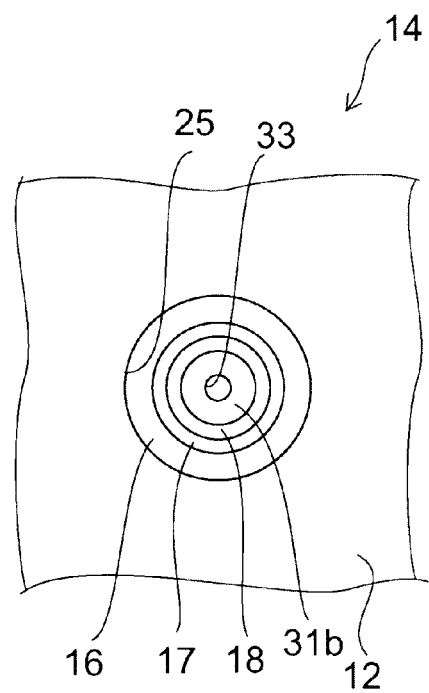

Next, as shown in FIGS. 13A and 13B, thermal oxidation is performed in an oxygen gas (O$_2$) atmosphere. The condition for this thermal oxidation is such that the temperature is e.g. 700 to 1200° C. and the duration is e.g. 1 minute to 1 hour. Thus, a silicon oxide layer 31a is formed at the interface between the channel silicon crystal film 30 and the silicon oxide film 18 and the like. The thickness of the silicon oxide layer 31a is e.g. approximately 0.2 to 2 nm. Here, by this thermal oxidation, a silicon oxide layer 31b is formed also at the exposed surface of the channel silicon crystal film 30. The thickness of this silicon oxide layer 31b is approximately 1 to 2 times the thickness of the silicon oxide layer 31a, although it depends on the thickness and thermal treatment condition of the channel silicon crystal film 30. On the other hand, the silicon oxide layer is scarcely formed at the interface between the channel silicon crystal film 30 and the silicon substrate 11.

Figure 14A:
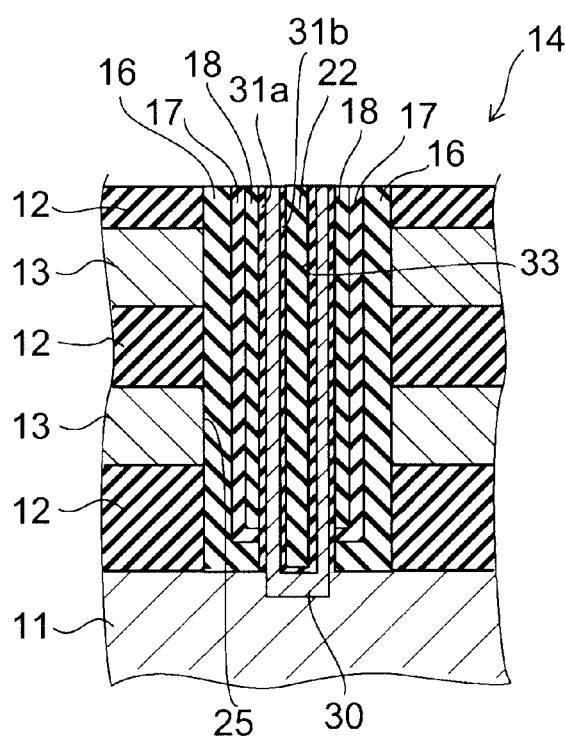
Figure 14B:
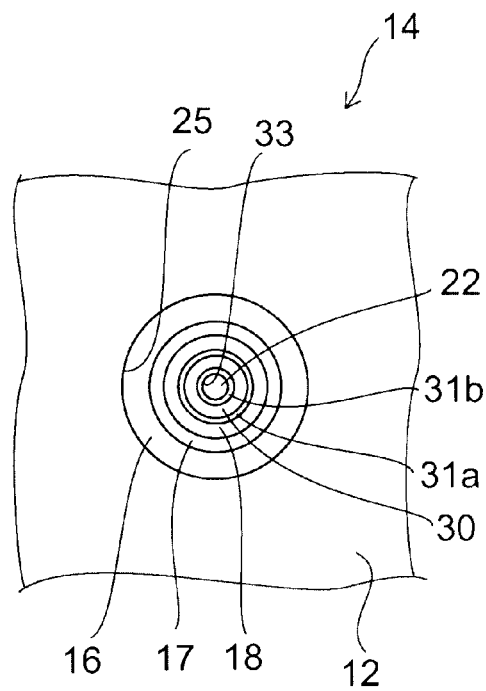

Next, as shown in FIGS. 14A and 14B, a method similar to that in the above first embodiment is used to bury a silicon oxide 22 in the cavity 33. Next, CMP is performed to remove the silicon oxide layer 31b from above the upper surface of the stacked body 14 to expose the upper surface of the channel silicon crystal film 30. Thus, a memory array section is formed on the silicon substrate 11. Subsequently, select gate transistors, interconnect layers, and peripheral elements (all not shown) are formed to manufacture a nonvolatile semiconductor memory device having a three-dimensional stacked structure.

As shown in FIGS. 14A and 14B, in the nonvolatile semiconductor memory device manufactured in this embodiment, a stacked body 14 with a plurality of interlayer insulating films (silicon oxide films 12) and gate electrodes (silicon films 13) alternately stacked therein is provided on a silicon substrate 11, and a cylindrical trench 25 is formed in the stacked body 14. A charge block film (alumina film 16), a charge storage film (silicon nitride film 17), and a tunnel insulating film (silicon oxide film 18) are provided in this order on the side surface of the trench 25, and a channel silicon crystal film 30 shaped like a cylindrical tube with the bottom closed is provided inside the trench 25 and connected to the silicon substrate 11. The inside of the channel silicon crystal film 30 constitutes a cavity 33 with the top open, and a silicon oxide 22 is buried inside the cavity 33. Furthermore, a silicon oxide layer 31a is formed at the interface between the tunnel insulating film (silicon oxide film 18) and the channel film (channel silicon crystal film 30), and a silicon oxide layer 31b is formed at the interface between the buried insulating film (silicon oxide 22) and the channel film (channel silicon crystal film 30).

Next, the function and effect of this embodiment are described.

According to this embodiment, it is possible to manufacture a nonvolatile semiconductor memory device having a three-dimensional stacked structure in which the channel of memory cell transistors is connected to the silicon substrate 11.

In this embodiment, as compared with the above first embodiment, under the same thermal oxidation condition, the ratio of the thickness of the silicon oxide layer 31b to the thickness of the silicon oxide layer 31a can be decreased. For instance, this ratio is from 1.5 to 3 in the above first embodiment, but can be from 1 to 2 in this embodiment. That is, in the channel silicon crystal film 30 shaped like a cylindrical tube, oxidation reaction is suppressed at the inner side surface, but accelerated at the outer side surface. This is presumably because the channel silicon crystal film 30 is concave at the inner side surface and convex at the outer side surface, and hence the internal stress generated with the progress of oxidation reaction is increased in the inner side surface and released in the outer side surface. Thus, by restricting thickening of the silicon oxide layer 31b and ensuring the thickness of the channel silicon crystal film 30 after thermal oxidation, a desired channel current can be obtained. Furthermore, the thermal oxidation temperature for forming a silicon oxide layer 31a with a desired thickness can be decreased, and hence thermal diffusion of elements can be restricted. Consequently, the structure of the memory array section can be made finer, and a nonvolatile semiconductor memory device with fewer memory malfunctions can be manufactured.

The function and effect of this embodiment other than the foregoing are the same as those of the above first embodiment. More specifically, also in this embodiment, a silicon oxide layer 31a is formed at the interface between the tunnel insulating film (silicon oxide film 18) and the channel film (channel silicon crystal film 30). Thus, interface states and fixed charges at this interface are reduced, and this embodiment can manufacture a nonvolatile semiconductor memory device in which the cell transistor is fast and has little threshold voltage variation. Also in this embodiment, like the above first embodiment, by thermal treatment in an oxygen gas atmosphere, the density of interface states and fixed charges can be decreased, for instance, from $1 \times 10^{12}$ cm$^{-2}$ or more to $1 \times 10^{11}$ cm$^{-2}$ or less.

In the example described in this embodiment, like the above first embodiment, thermal treatment is performed in an oxygen gas atmosphere to oxidize the surface of the channel silicon crystal film 30. Alternatively, like the above second embodiment, thermal treatment can be performed in a nitrogen monoxide gas atmosphere or a nitrous oxide gas atmosphere to oxynitridize the surface of the channel silicon crystal film 30. Thus, the function and effect similar to those of the above second embodiment can be achieved. Also in this case, in the channel silicon crystal film 30, oxynitridation reaction is suppressed at the inner side surface, but accelerated at the outer side surface. Hence, an effect similar to the foregoing can be achieved.

Furthermore, in this embodiment, a cylindrical tubular channel silicon crystal film 30 connected to the silicon substrate 11 is illustratively formed. However, this embodiment is not limited thereto. For instance, a cylindrical tubular channel silicon crystal film can be bent into a U-shape and electrically insulated from the silicon substrate.

Next, a fourth embodiment of the invention is described.

FIGS. 15A, 15B, 16A, and 16B illustrate a method for manufacturing a nonvolatile semiconductor memory device according to this embodiment, where each figure with the suffix A is a process cross-sectional view, and each figure with the suffix B is a process plan view.

Figure 17:
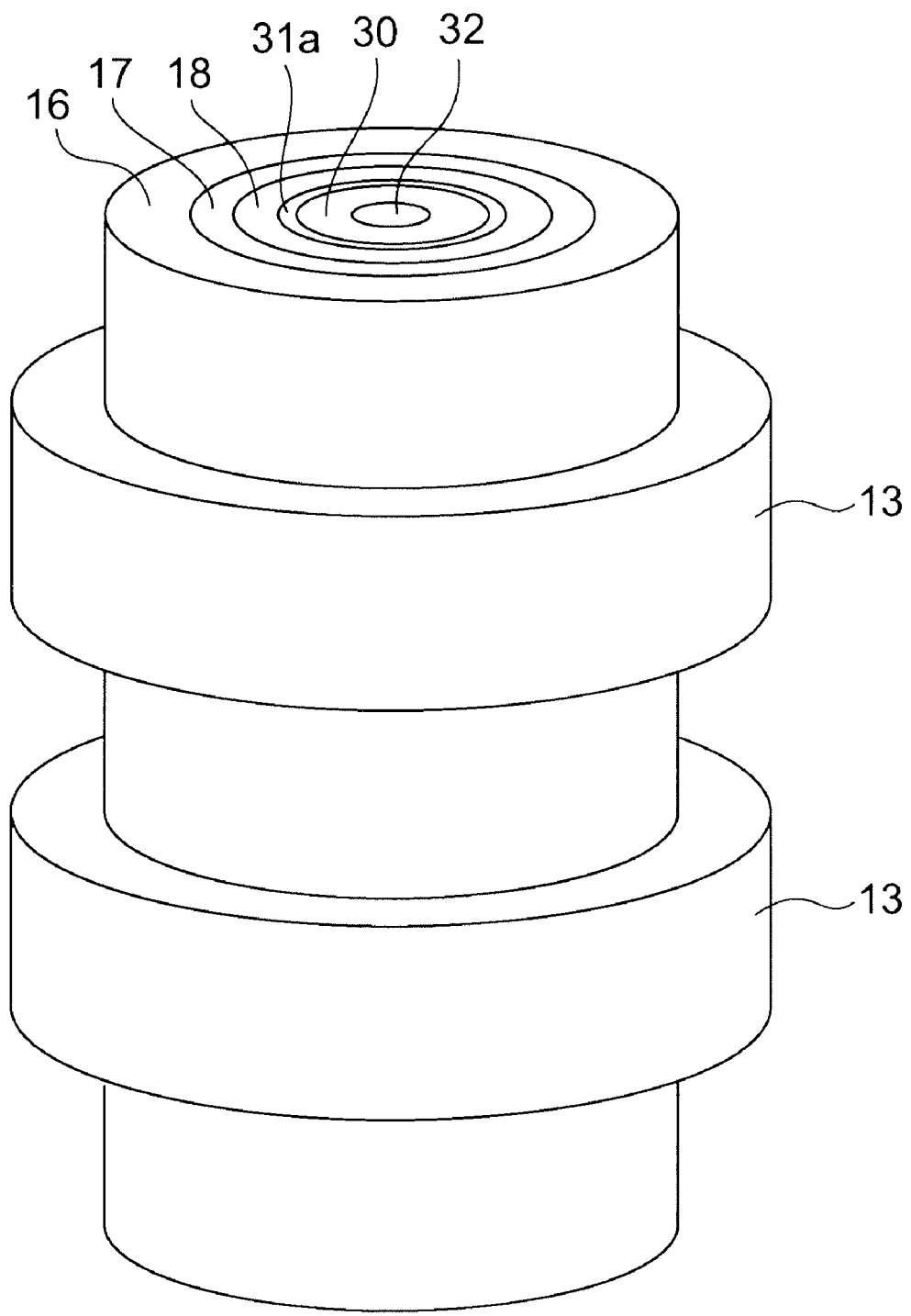
FIG. 17 is a perspective view illustrating a nonvolatile semiconductor memory device according to the fourth embodiment.

FIG. 17 is a perspective view illustrating a nonvolatile semiconductor memory device according to this embodiment.

In FIG. 17, for convenience of illustration, the silicon substrate 11 and the silicon oxide film 12 are not shown.

This embodiment is different from the above third embodiment in that polycrystalline silicon, rather than the silicon oxide 22 (see FIG. 14), is buried inside the channel silicon crystal film 30 shaped like a cylindrical tube.

First, by a method similar to that in the above third embodiment, a structure shown in FIGS. 13A and 13B is fabricated. Next, as shown in FIGS. 15A and 15B, wet etching is performed using a dilute hydrofluoric acid solution to remove the silicon oxide layer 31b formed at the exposed surface of the channel silicon crystal film 30. Here, in the case where a silicon oxynitride layer is formed at the exposed surface of the channel silicon crystal film 30 by thermal oxynitridation in an atmosphere containing nitrogen monoxide gas or nitrous oxide gas, this silicon oxynitride layer is removed by wet etching using a phosphoric acid solution. Thus, the channel silicon crystal film 30 is exposed to the inner surface of the cavity 33.

Next, as shown in FIGS. 16A and 16B, impurity-doped amorphous silicon is deposited on the entire surface and buried inside the cavity 33. Subsequently, CMP is performed to remove the amorphous silicon deposited on the stacked body 14 to expose the upper surface of the channel silicon crystal film 30. Next, thermal annealing is performed at a temperature of e.g. 500° C. or more to crystallize the amorphous silicon into polycrystalline silicon 32. Subsequently, select gate transistors, interconnect layers, and peripheral elements (all not shown) are formed to manufacture a nonvolatile semiconductor memory device having a three-dimensional stacked structure.

As shown in FIGS. 16A, 16B, and 17, in the nonvolatile semiconductor memory device according to this embodiment, the cylindrical tubular channel silicon crystal film 30 formed on the side surface of the trench 25 and the polycrystalline silicon 32 buried therein constitute a vertically extending silicon pillar connected to the silicon substrate 11. This silicon pillar functions as a channel of cell transistors.

Next, the function and effect of this embodiment are described.

In this embodiment, as compared with the above third embodiment, the silicon pillar serving as a channel has a larger cross-sectional area, hence allowing a large cell current to flow therein. Consequently, the operating speed of the cell transistor is significantly increased. The function and effect of this embodiment other than the foregoing are the same as those of the above third embodiment.

In this embodiment, a cylindrical tubular channel silicon crystal film 30 connected to the silicon substrate 11 is illustratively formed. However, this embodiment is not limited thereto. For instance, a cylindrical tubular channel silicon crystal film can be bent into a U-shape and electrically insulated from the silicon substrate.

Next, a comparative example of the fourth embodiment is described.

Figure 18:
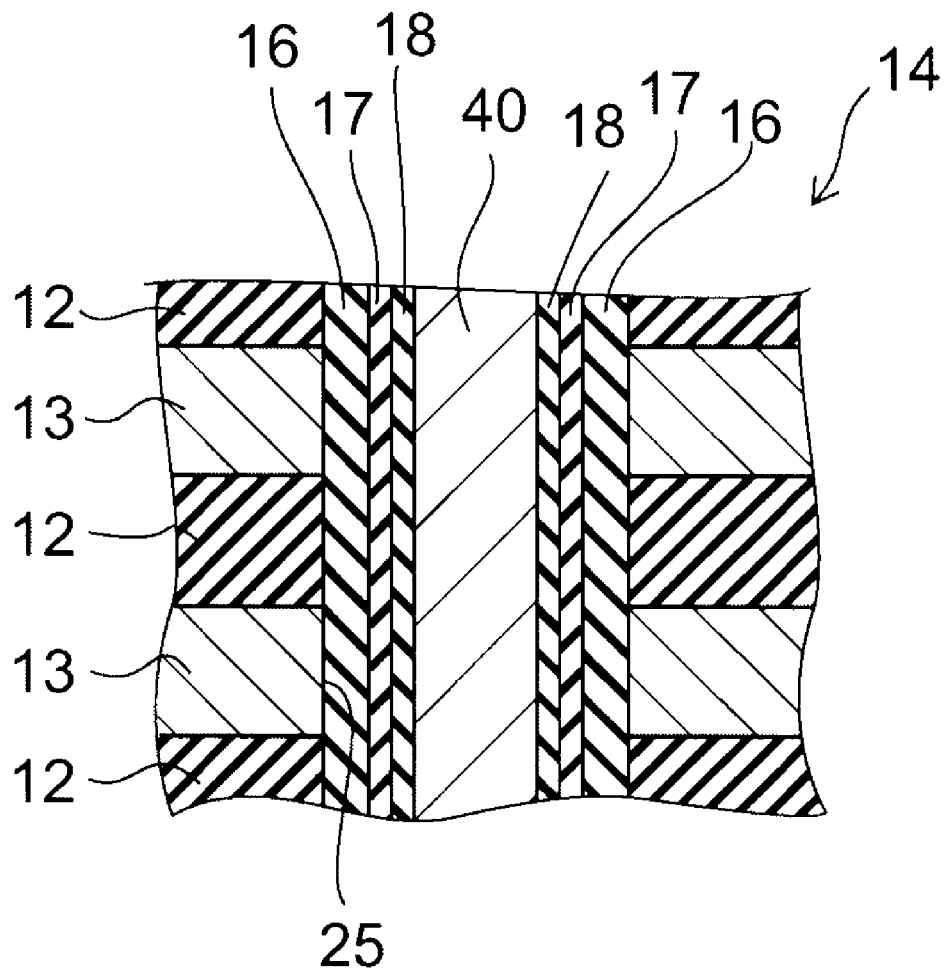
FIG. 18 is a cross-sectional view illustrating a nonvolatile semiconductor memory device according to a comparative example of the fourth embodiment.

FIG. 18 is a cross-sectional view illustrating a nonvolatile semiconductor memory device according to this comparative example.

As shown in FIG. 18, also in this comparative example, like the above fourth embodiment, a trench 25 is formed in the stacked body 14, and an alumina film 16, a silicon nitride film 17, and a silicon oxide film 18 are formed in this order on the inner surface of the trench 25. Next, an amorphous silicon film is formed by CVD on the silicon oxide film 18 and crystallized into a cylindrical channel silicon crystal film 40. However, in this comparative example, the formation of the amorphous silicon film is not followed by thermal treatment in an oxygen gas atmosphere or in an atmosphere containing nitrogen monoxide gas or nitrous oxide gas. Hence, no silicon oxide layer or silicon oxynitride layer is formed at the interface between the silicon oxide film 18 and the channel silicon crystal film 40.

In this comparative example, microscopic structural defects generated during deposition of the amorphous silicon film on the silicon oxide film 18 remain to the end and generate interface states and fixed charges at the interface between the silicon oxide film 18 and the channel silicon crystal film 40. This decreases the operating speed of the cell transistor. Furthermore, threshold voltage variation becomes noticeable after prolonged operation and causes malfunctions in the memory cell. In contrast, according to the above first to fourth embodiment, thermal treatment is performed in an oxygen gas atmosphere or in an atmosphere containing nitrogen monoxide gas or nitrous oxide gas to form a silicon oxide layer or silicon oxynitride layer at the interface between the silicon oxide film constituting the tunnel insulating film and the channel silicon crystal film constituting the channel film. Hence, interface states and fixed charges at this interface can be reduced.

The invention has been described with reference to the embodiments. However, the invention is not limited to these embodiments. For instance, the invention is also applicable to the case where the memory cell is an MNOS (metal-nitride-oxide-silicon) type memory cell in which the charge block film is omitted. Furthermore, it is necessary for the channel film to contain silicon as principal component, but the invention is also applicable to the case where the channel film contains dopant elements, such as boron or phosphorus, and contains germanium, carbon, nitrogen or oxygen. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A method for manufacturing a nonvolatile semiconductor memory device, comprising:
    forming a charge storage film, a tunnel insulating film, and a channel film made of a silicon crystal in this order on a gate electrode;
    forming a silicon oxynitride layer at an interface between the tunnel insulating film and the channel film by performing thermal treatment in a nitrogen monoxide gas atmosphere;
    forming a stacked body by alternately stacking a plurality of interlayer insulating films and the gate electrodes on a substrate;
    forming a trench in the stacked body,
    the charge storage film, the tunnel insulating film, and the channel film being formed on an inner surface of the trench, and
    a cavity being formed in the trench when the thermal treatment is performed, the cavity communicating with outside of the trench, and the channel film being exposed to an inner surface of the cavity.

2. The method according to claim 1, wherein a condition for the thermal treatment is such that a temperature is 700 to 1200° C. and duration is 1 minute to 1 hour.

3. The method according to claim 1, wherein the forming the channel film includes:
    depositing an amorphous silicon film; and
    crystallizing the amorphous silicon film.

4. The method according to claim 1, wherein the trench is shaped like a groove, and the method further comprises:
    dividing the channel film along an extending direction of the trench.

5. The method according to claim 1, wherein the trench is shaped like a cylinder extending in a stacking direction of the stacked body.

6. The method according to claim 5, further comprising:
    after the thermal treatment, exposing the channel film to the inner surface of the cavity; and
    burying silicon in the cavity.

7. The method according to claim 1, further comprising:
    burying an insulating film in the cavity.

8. The method according to claim 1, further comprising:
    forming a charge block film on the gate electrode,
    the charge storage film being formed on the charge block film.

* * * * *